United States Patent
Sindalovsky et al.

(10) Patent No.: US 7,526,033 B2
(45) Date of Patent: Apr. 28, 2009

(54) SERIALIZER DESERIALIZER (SERDES) TESTING

(75) Inventors: Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 754 days.

(21) Appl. No.: 11/051,801

(22) Filed: Feb. 4, 2005

(65) Prior Publication Data

US 2006/0176943 A1 Aug. 10, 2006

(51) Int. Cl.
*H04B 3/00* (2006.01)
*H04J 3/04* (2006.01)

(52) U.S. Cl. .................... 375/257; 370/535

(58) Field of Classification Search .......... 375/257, 375/219; 370/535, 536, 537, 358; 716/4, 716/11, 12; 326/38
See application file for complete search history.

(56) References Cited

U.S. PATENT DOCUMENTS

| | | | |
|---|---|---|---|
| 6,834,367 B2 * | 12/2004 | Bonneau et al. | ............. 714/738 |
| 6,874,107 B2 | 3/2005 | Lesea | |
| 7,161,964 B2 * | 1/2007 | Lentine et al. | ............. 370/535 |
| 2003/0031133 A1 | 2/2003 | Momtaz | |
| 2005/0047495 A1 * | 3/2005 | Yoshioka | ............. 375/219 |

* cited by examiner

*Primary Examiner*—Khai Tran (57) ABSTRACT

The various embodiments of the invention provide an apparatus, system and method of testing a serializer and deserializer data communication apparatus (SERDES). The serializer and deserializer data communication apparatus has a plurality of serialize data communication channels adapted to convert parallel data to serial data and a plurality of deserialize data communication channels adapted to convert serial data to parallel data. An exemplary method provides for coupling an output of a serialize data communication channel and an input of a deserialize data communication channel to provide a serial data loop-back connection and coupling an output of a deserialize data communication channel and an input of a serialize data communication channel to provide a parallel data loop-back connection. Input test data is provided to a first serialize or deserialize data communication channel, and is successively serialized and deserialized through each corresponding serialize data communication channel and deserialize data communication channel to provide output test data. The output test data and the input test data are then compared, with SERDES devices having acceptable or unacceptable bit error rates respectively designated as passed or failed.

26 Claims, 6 Drawing Sheets

SERIALIZER DESERIALIZER (SERDES) TESTING

FIELD OF THE INVENTION

This invention relates generally to testing of electronic equipment, and in particular, relates to high-speed serial and parallel testing of serializer/deserializer devices, both in field applications and through automated test equipment, and is more particularly directed toward testing of serializer/deserializer devices through simultaneous testing of multiple channels using one source of data.

BACKGROUND OF THE INVENTION

Serializer/deserializer ("SERDES") devices are frequently used in high-speed communication networks in which an interface must be provided between parallel bus-connected devices and high-speed serial communication networks, such as those implemented through optical fiber interconnections. Individual channels of multichannel SERDES devices are currently tested separately using an on-chip serial feedback, or wired on-the-board serial feedback. Current testing techniques require separate testing of each channel of a SERDES device and do not allow for the simultaneous testing of multiple channels using one source of data.

For example, U.S. Published Application No. 2003/0023912, entitled "Integrated Testing of Serializer/Deserializer in FPGA", describes a field programmable gate array (FPGA) device that includes a high-speed serializer/deserializer (SERDES). The configurable logic blocks (CLBs) of the FPGA are initially configured to test the SERDES by stimulating the SERDES with high-speed pattern generation and optional CRC checks. The test is evaluated by a bit error rate tester and the results are stored for later access. Test results are accessible by external test equipment. The elements of the FPGA used for testing are then reprogrammed for proper device operation. In the system described, each SERDES channel is individually tested, with the testing logic duplicated for each channel.

In U.S. Published Application No. 2003/0031133, entitled "Line Loop Back for Very High Speed Application", a test methodology for high-speed SERDES devices is described in which externally generated parallel data are applied through a network of buffers and multiplexers to the input stage of a serializer, the communications link is looped back so that the high-speed serial data traverses the serial transmission channel in both directions and is deserialized and presented to external analysis circuitry through low-speed logic. Each SERDES channel, however, is tested on a one-by-one basis, with duplication of the specialized low-speed logic for each path being tested.

Accordingly, a need arises for an apparatus, system and method that easily and efficiently permits testing of all channels of SERDES devices, simultaneously and at full or lower speed, without a need to duplicate test equipment or laboriously reconfigure the device for normal operation following testing.

SUMMARY OF THE INVENTION

The various embodiments provide an apparatus, system and method that easily and efficiently permits testing of all channels of SERDES devices, simultaneously and at full or lower speed, without a need to duplicate test equipment or laboriously reconfigure the device for normal operation following testing.

In a first aspect, the various embodiments provide a serializer and deserializer data communication apparatus. The apparatus includes a plurality of serialize data communication channels, a plurality of deserialize data communication channels, a first plurality of switches, and a second plurality of switches. The plurality of serialize data communication channels are adapted to convert parallel data to serial data, with a first serialize data communication channel of the plurality of serialize data communication channels designated to receive input parallel test data for subsequent serialization. The plurality of deserialize data communication channels are adapted to convert serial data to parallel data, with each deserialize data communication channel paired with a corresponding serialize data communication channel of the plurality of serialize data communication channels, and with a first deserialize data communication channel of the plurality of deserialize data communication channels designated to provide output parallel test data. Each switch of the first plurality of switches is coupled between an output of a serialize data communication channel and an input of a deserialize data communication channel to provide a serial data loop-back connection. Each switch of the second plurality of switches coupled between an output of a deserialize data communication channel and an input of a serialize data communication channel to provide a parallel data loop-back connection.

In this aspect, a memory may be coupled to the first serialize data communication channel to store the input parallel test data, and the memory may be further coupled to the first deserialize data communication channel to store the output parallel test data. The apparatus may also include integrated testing circuitry coupled to the memory and to the first deserialize data communication channel, which is adapted to compare the input parallel test data and output parallel test data and determine a measured bit error rate. The integrated testing circuitry may be further adapted to provide a pass indication when the measured bit error rate is less than a first predetermined bit error rate or a fail indication when the measured bit error rate is greater than a second predetermined bit error rate. In addition, the integrated testing circuitry may be further adapted to provide for latency between the input parallel test data and the output parallel test data.

In other aspects, a bit error rate tester may be coupled to the first deserialize data communication channel, where the bit error rate tester may be adapted to compare the input parallel test data and output parallel test data and determine a measured bit error rate, and further adapted to provide a pass indication when the measured bit error rate is less than a predetermined bit error rate.

In addition, the first plurality of switches and second plurality of switches may be adapted to be enabled during a test mode of the serializer and deserializer data communication apparatus, and disabled during a data transmission mode of the serializer and deserializer data communication apparatus.

Similarly in another aspect of the invention, the various embodiments provide another serializer and deserializer data communication apparatus. The apparatus includes a plurality of serialize data communication channels, a plurality of deserialize data communication channels, a first plurality of switches, and a second plurality of switches. In this embodiment, the plurality of serialize data communication channels may be adapted to convert parallel data to serial data, with a first serialize data communication channel of the plurality of serialize data communication channels designated to provide output serial test data. The plurality of deserialize data communication channels may be adapted to convert serial data to parallel data, with each deserialize data communication channel paired with a corresponding serialize data communication channel of the plurality of serialize data communication channels, and with a first deserialize data communication channel of the plurality of deserialize data communication channels designated to receive input serial test data. Each switch of the first plurality of switches may be coupled between an output of a serialize data communication channel and an input of a deserialize data communication channel to provide a serial data loop-back connection. Each switch of the second plurality of switches may be coupled between an output of a deserialize data communication channel and an input of a serialize data communication channel to provide a parallel data loop-back connection.

In another aspect of the invention, the various embodiments provide a method of testing a serializer and deserializer data communication apparatus, in which the serializer and deserializer data communication apparatus has a plurality of serialize data communication channels adapted to convert parallel data to serial data and further having a plurality of deserialize data communication channels adapted to convert serial data to parallel data. The method embodiment provides for coupling an output of a serialize data communication channel and an input of a deserialize data communication channel to provide a serial data loop-back connection; coupling an output of a deserialize data communication channel and an input of a serialize data communication channel to provide a parallel data loop-back connection; providing input parallel test data to a first serialize data communication channel of the plurality of serialize data communication channels; successively serializing and deserializing the input parallel test data through each corresponding serialize data communication channel of the plurality of serialize data communication channels and deserialize data communication channel of the plurality of deserialize data communication channels to provide output parallel test data; and comparing the output parallel test data and the input parallel test data.

In another aspect of the invention, the various embodiments provide a method of testing a serializer and deserializer data communication apparatus, in which the serializer and deserializer data communication apparatus have a plurality of serialize data communication channels adapted to convert parallel data to serial data and further having a plurality of deserialize data communication channels adapted to convert serial data to parallel data. The method provides for coupling an output of a serialize data communication channel and an input of a deserialize data communication channel to provide a serial data loop-back connection; coupling an output of a deserialize data communication channel and an input of a serialize data communication channel to provide a parallel data loop-back connection; providing input serial test data to a first deserialize data communication channel of the plurality of deserialize data communication channels; successively deserializing and serializing the input serial test data through each corresponding deserialize data communication channel of the plurality of deserialize data communication channels and serialize data communication channel of the plurality of serialize data communication channels to provide output serial test data; and comparing the output serial test data and the input serial test data.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, in which.

DETAILED DESCRIPTION OF THE EXEMPLARY EMBODIMENTS

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

Figure 1:
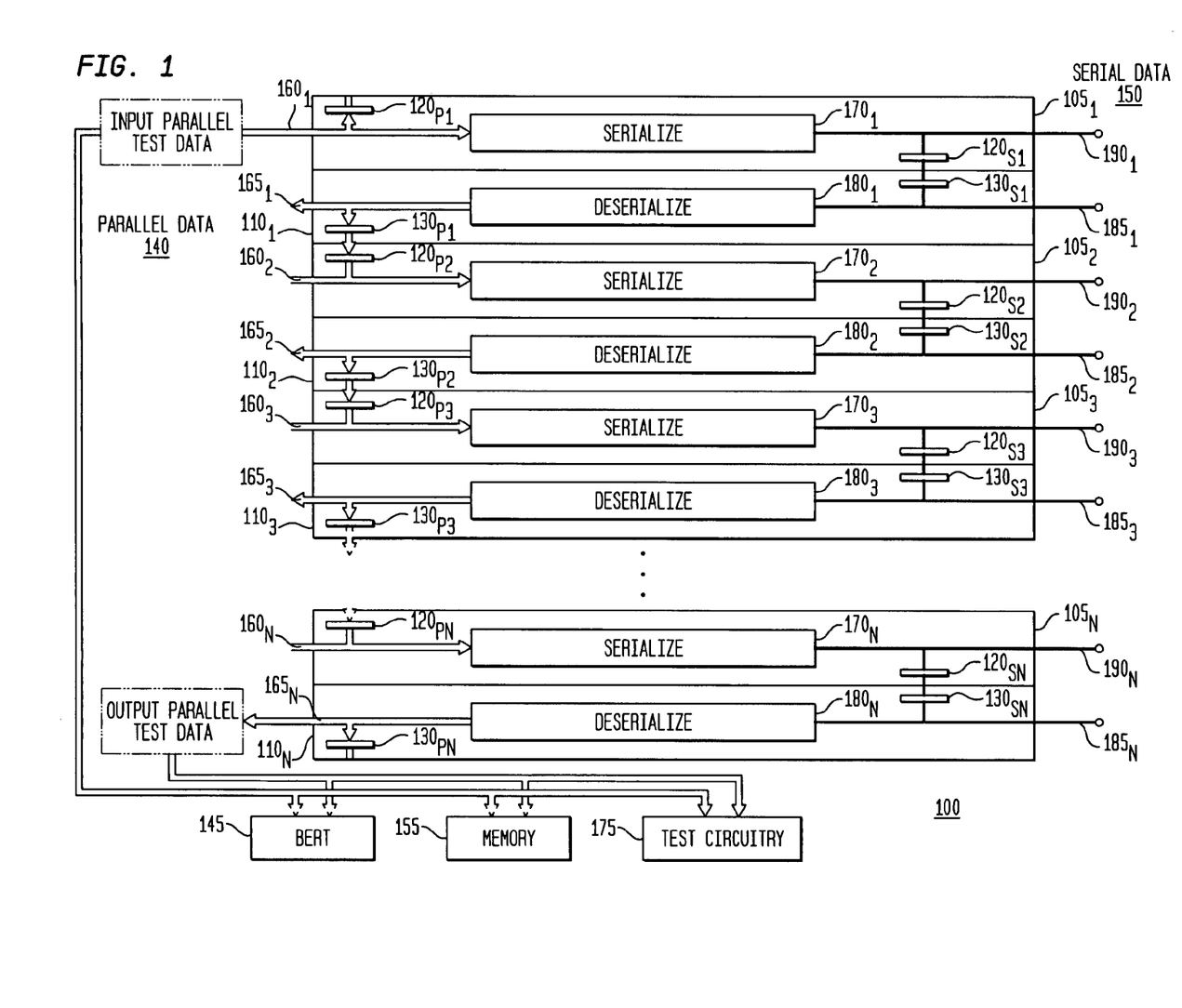
FIG. 1 is a block diagram illustrating a first exemplary apparatus embodiment in accordance with the present invention.

Referring now to the drawings wherein like reference numerals are used to identify identical components in the various views, FIG. 1 is a block diagram illustrating a first exemplary apparatus embodiment 100 in accordance with the present invention. As illustrated in FIG. 1, the apparatus 100 is a serial/deserializer (SERDES) device having a plurality of transmit (or serialize) 105 and receive (or deserialize) 110 channels (with transmit and receive being designated from the parallel data side 140), illustrated as transmit channels $105_1$, $105_2$ through $105_N$, and receive channels $110_1$, $110_2$ through $110_N$, for "N" paired transmit and receive channels of the apparatus 100. A paired serialize (transmit) 105 channel and deserialize (receive) 110 channel equivalently may also be considered to form one channel.

The apparatus 100 further includes a plurality of switches 120 and 130 which may be embodied, for example, as transistors, multiplexers, or other switching devices. It should be noted that, on the parallel data side 140, there will be a corresponding switch 120 or 130 for each parallel data line, which are not separately illustrated for clarity and ease of discussion. The parallel data side (140) switches 120 and 130 are further designated by a subscript "P" and a channel index, and the serial data side (150) switches 120 and 130 are further designated by a subscript "S" and a channel index (e.g., $120_{P1}$ designates a switch 120 on the parallel data side 140 for a first channel ($105_1$). To provide a testing mode for the apparatus 100 in accordance with the present invention, most of the switches 120 and 130 (except $120_{P1}$ and $130_{PN}$) are enabled (i.e., on, conducting or closed), allowing data transmission between the plurality of channels 105 and 110, which may be at any selected data rate, such as a full or reduced data rates. As illustrated, only one such set of switches 120 or 130 are needed for each paired serialize (transmit) 105 channel and deserialize (receive) 110 channel, not both (i.e., for each paired serialize (transmit) 105 channel and deserialize (receive) 110 channel, on each of the parallel data 140 and serial data 150 sides, the testing mode may be implemented using either a switch 120 or 130). Both sets of switches are illustrated, for purposes of examples of suitable circuit layouts. For example, one suitable circuit may utilize the switches 120, while another may utilize the switches 130, or various combinations of switches 120 and 130. It will be understood by those of skill in the art that in the event one of the switches 120 or 130 is not utilized, a conductive path or line will be instantiated or otherwise fabricated in its place. In addition, use of both sets of switches 120 and 130 may be utilized to decrease capacitance in a non-testing mode, by disabling the various conductive paths. In the non-testing mode, the switches 120 and/or 130 are off, disabled, non-conducting or open, such as for typical or normal communication modes.

As indicated above, for the testing mode for this apparatus 100, all of the switches 120 and 130, except $120_{P1}$ and $130_{PN}$, are on and conducting. Switches $120_{P1}$ and $130_{PN}$ are provided so that each paired serialize (transmit) 105 channel and deserialize (receive) 110 channel has an identical layout, which may be repeated without modification for any number of desired and selected communication channels, which are generally placed adjacent to one another in a typical SERDES device portion of an integrated circuit.

For the apparatus 100 illustrated in FIG. 1, for testing mode, input parallel test data is provided on transmit line or bus $160_1$, is serialized by serializer $170_1$, and serial data is output on serial line $190_1$. As switches $120_{S1}$ and $130_{S1}$ are enabled, the serial data is also provided on serial line $185_1$, for input into deserializer $180_1$ and conversion into parallel data, output on parallel line or bus $165_1$. As switches $130_{P1}$ and $120_{P2}$ are enabled, the parallel data is also provided on parallel line or bus $160_2$, for input into serializer $170_2$ and conversion into serial data, output on serial line $190_2$. As switches $120_{S2}$ and $130_{S2}$ are enabled, the serial data is also provided on serial line $185_2$, for input into deserializer $180_2$ and conversion into parallel data, output on parallel line or bus $165_2$. As switches $130_{P2}$ and $120_{P3}$ are enabled, the parallel data is also provided on parallel line or bus $160_3$, for input into serializer $170_3$ and conversion into serial data, output on serial line $190_3$. This process continues, with serial data output being provided to the input of a next deserializer 180, and parallel data output being provided to the input of a next serializer 170, for all of the paired serialize (transmit) 105 and deserialize (receive) 110 channels.

As illustrated in FIG. 1, output parallel test data which has been serialized and deserialized through all of the paired serialize 105 and deserialize 110 channels is provided on parallel line or bus $165_N$, and may then be checked for errors. As a consequence, all of the paired serialize 105 and deserialize 110 channels forming the SERDES device are tested simultaneously, as test data is "chained" (e.g., "daisy chained") or "snaked" through each channel, to provide one set of output test data for comparision with the input test data, typically through a bit error rate tester ("BERT") 145 (which is typically a stand-alone device). Alternatively, the output test data may be stored in a memory 155 (such as on-chip memory), and either accessed at a later time for comparison using a BERT 145, or compared using additional, integrated testing circuitry 175. As another alternative, the output test data may be compared in real-time with input test data using either an external BERT 145 or on-chip test circuitry 175. Each of these testing variations is also illustrated in and discussed below with reference to FIG. 5.

In addition, a BERT 145 or other device may be utilized to generate the input parallel test data provided on line or bus $160_1$, and to compare the output parallel test data provided on line or bus $165_N$ to determine the presence of any bit errors. Such testing will also generally include corresponding testing of any error correction coding, which may be either included within the input test data or provided by any intervening serializer or deserializer, or other intervening device. It should be noted that the output parallel test data has some latency with respect to the input parallel test data. Typical latency detection, as known in the art for one channel latency detection, may be applied to the multiple channel latency of the testing herein.

Figure 2:
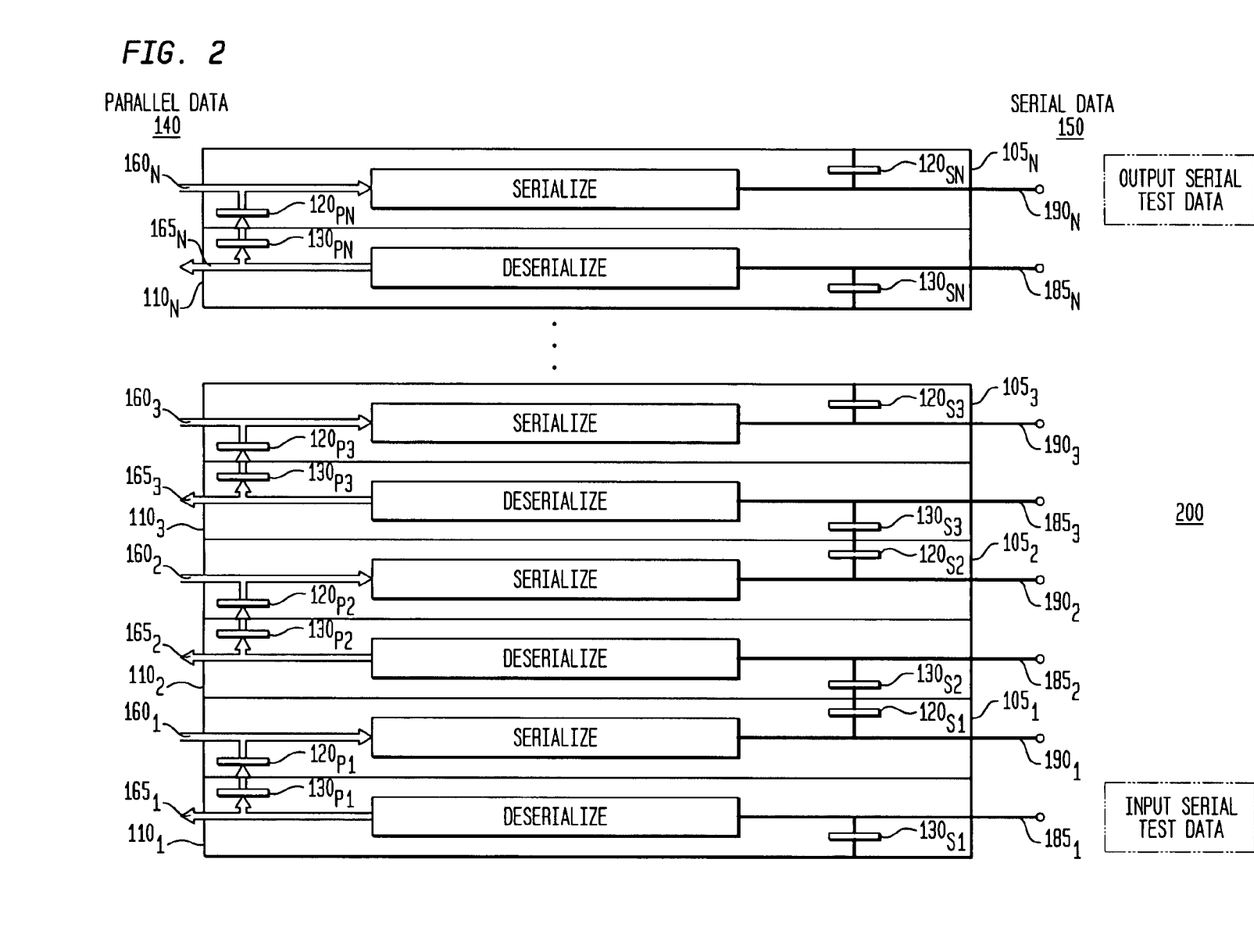
FIG. 2 is a block diagram illustrating a second exemplary apparatus embodiment in accordance with the present invention.

FIG. 2 is a block diagram illustrating a second exemplary apparatus embodiment 200 in accordance with the present invention. Apparatus 200 operates similarly to apparatus 100, except the testing occurs from the serial side 150, using serial input test data (input on serial line $185_1$), which is tested against output serial test data provided on serial line $190_N$. Again, the various switches 120 and 130 are enabled during testing mode, with the exceptions of $120_{SN}$ and $130_{S1}$. As indicated above, only one set of switches 120 or 130 is also required. Not separately illustrated, the input and output serial test data will also be compared using, for example, a BERT 145 or test circuitry 175, with corresponding accommodation for latency in the output data.

Figure 3:
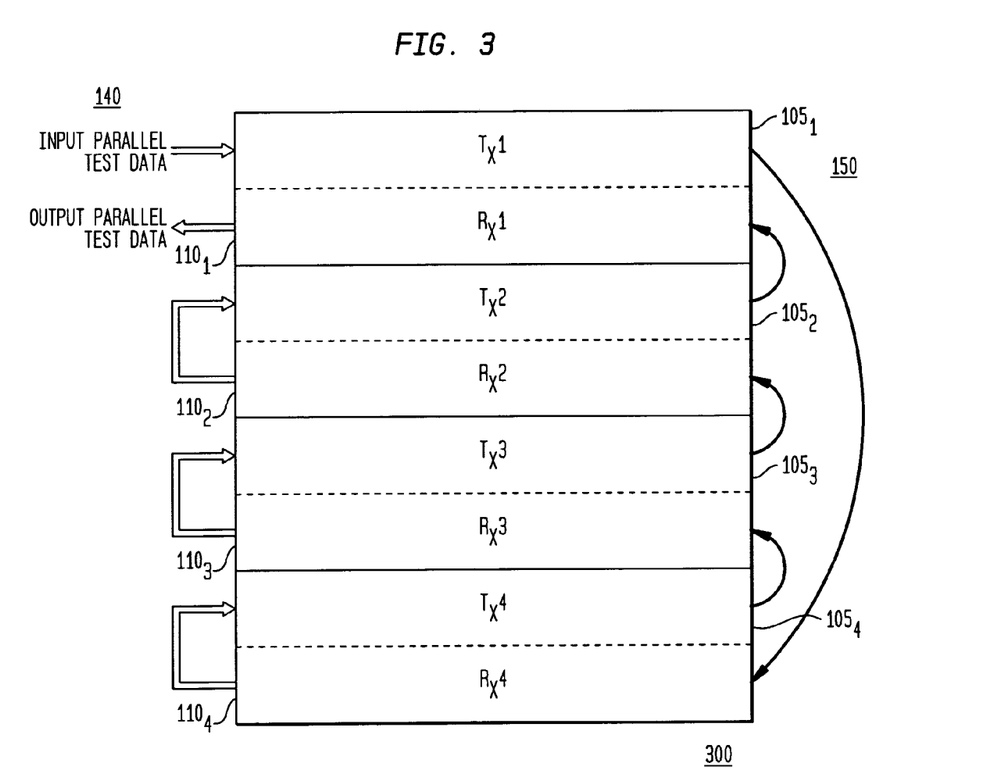
FIG. 3 is a block diagram illustrating a third exemplary apparatus embodiment in accordance with the present invention.
Figure 4:
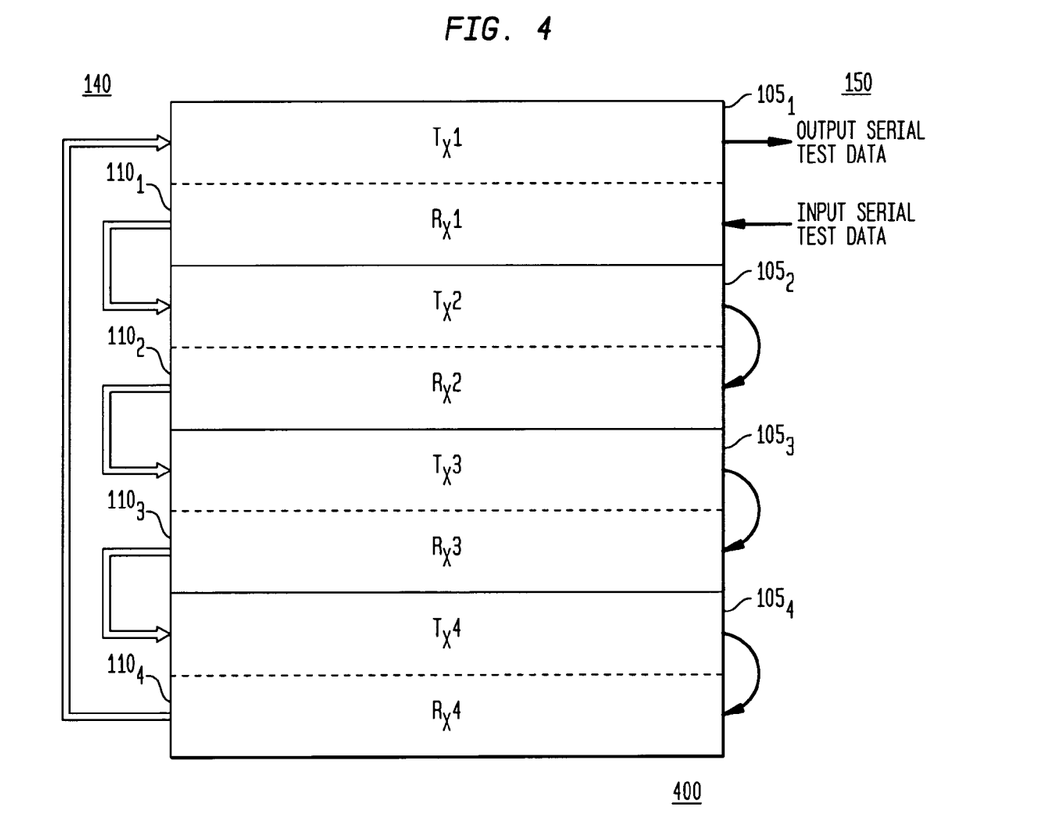
FIG. 4 is a block diagram illustrating a fourth exemplary apparatus embodiment in accordance with the present invention.

As may be apparent from the inventive apparatuses 100 and 200, there are a wide variety of switchable connections available to implement the present invention. Such additional configurations are illustrated in FIGS. 3 and 4, which are simplified to illustrate the chaining of data paths. FIG. 3 is a block diagram illustrating a third exemplary apparatus embodiment 300 in accordance with the present invention, in which input parallel test data is provided to transmit (serialize) channel $105_1$, while the output parallel test data is provided on receive (deserialize) channel $110_1$. FIG. 4 is a block diagram illustrating a fourth exemplary apparatus embodiment 400 in accordance with the present invention, in which input serial test data is provided to receive (deserialize) channel $110_1$, while the output serial test data is provided on transmit (serialize) channel $105_1$. Not separately illustrated, the input and output parallel (FIG. 3) or serial (FIG. 4) test data will also be compared using, for example, a BERT 145 or test circuitry 175, with corresponding accommodation for latency in the output data.

While the various apparatus embodiments have illustrated various switches incorporated into the various transmit and receive channels of a multichannel SERDES device, it will be apparent to those of skill in the art that the multichannel testing of the present invention may be provided equivalently using external connections, such as external connections provided on a testing board. For example, the parallel loop-back (in which received data is provided back to a transmit channel) configuration of FIG. 3 may be provided more easily in an integrated (on-chip) embodiment, while a serial loop-back configuration of FIG. 4 may also be provided using external connections, such as those available on a probe or testing board.

Figure 5:
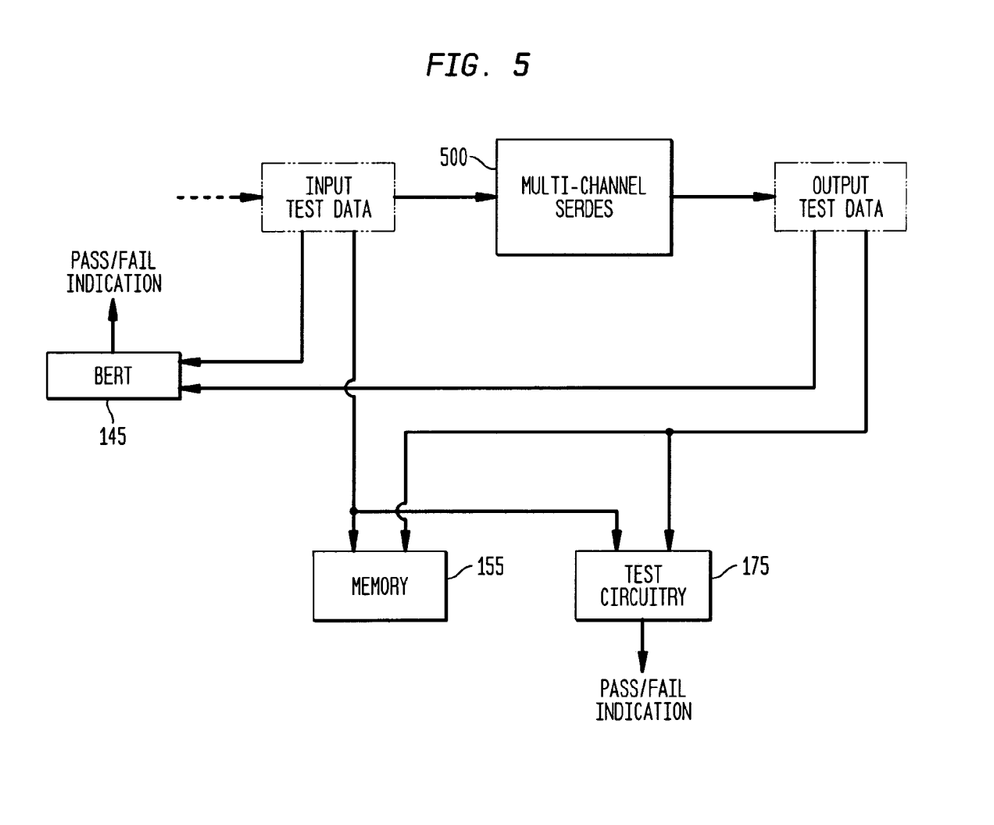
FIG. 5 is a block diagram illustrating a plurality of exemplary system embodiments in accordance with the present invention.

FIG. 5 is a block diagram illustrating a plurality of exemplary system embodiments in accordance with the present invention. Any of the various systems provide for comparison of one or more sets of output test data (from an output channel of a multichannel SERDES 500 (such as those illustrated as apparatuses 100, 200, 300 or 400)) with corresponding one or more sets of input test data provided to the multichannel SERDES 500. In a first system embodiment, such comparison is provided through a bit error rate tester (BERT) 145 as a stand-alone (off-chip) device. As a second system embodiment, the output test data may be stored in a memory 155 (such as on-chip memory), and either accessed at a later time for comparison using a BERT 145, or compared using additional, integrated testing circuitry 175. As another alternative system embodiment, the output test data may be compared in real-time with input test data using either an external BERT 145 or on-chip test circuitry 175. As indicated above, either BERT 145 or integrated testing circuitry 175 may also be utilized to generate the input test data. In addition, the BERT 145 or integrated testing circuitry 175 should provide for latency and/or skew detection, differences in framing, and use of error correction coding. In addition, the BERT 145 or integrated testing circuitry 175 will generally also provide for any clock or edge detection, if required by a particular implementation. The system output of each of the various embodiments will provide a pass or fail indication, indicating either acceptable or unacceptable bit error rates for the entire multichannel SERDES 500. For example, the measured bit error rate (from comparing the output and input test data) may be compared to a predetermined bit error rate, with the SERDES 500 designated as pass or fail depending on whether the measured bit error rate is at/below or above the predetermined rate.

Figure 6:
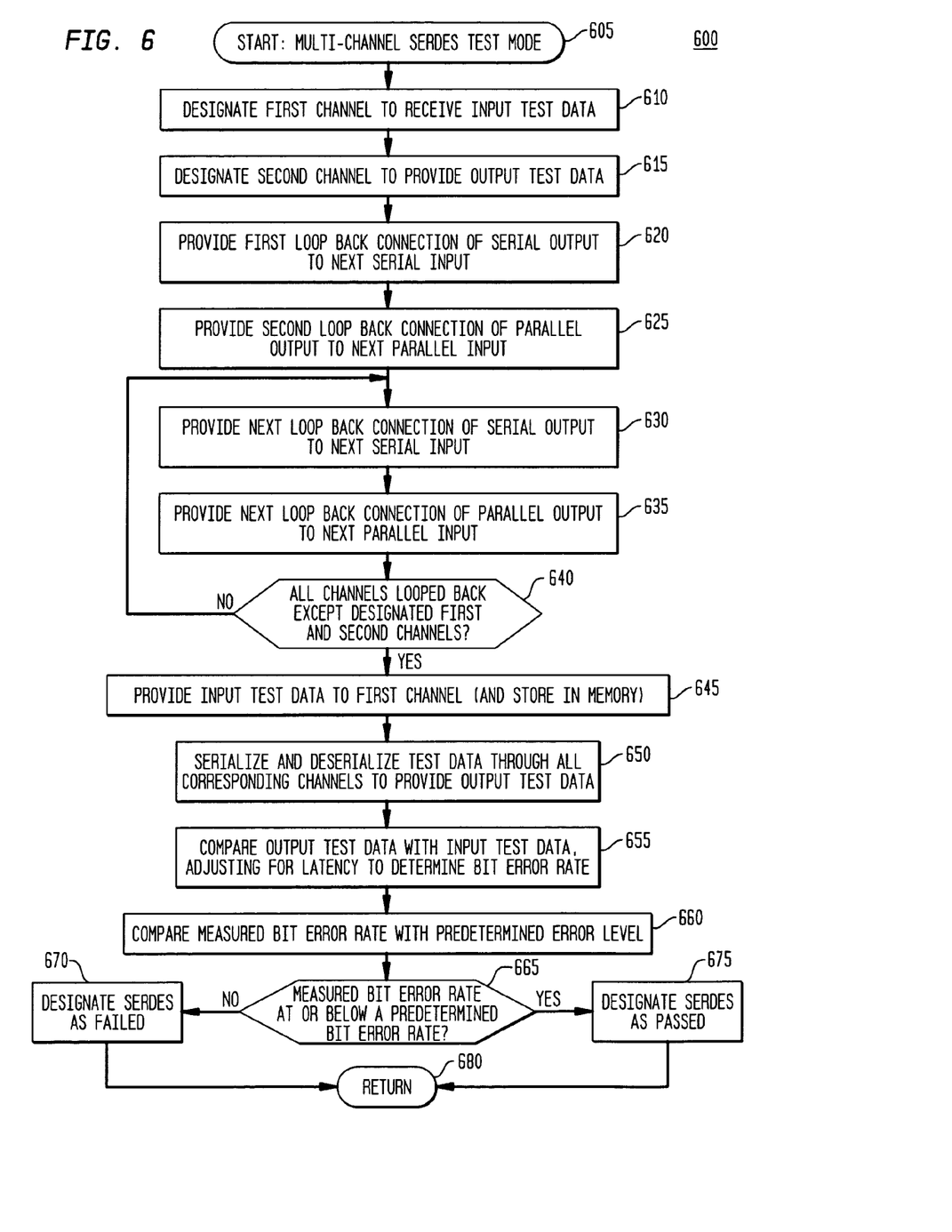
FIG. 6 is a flow chart illustrating an exemplary method embodiment in accordance with the present invention.

FIG. 6 is a flow chart illustrating an exemplary method embodiment 600 in accordance with the present invention. The multichannel SERDES testing begins, start step 605, with designation of a first channel or subchannel for receiving the input test data (for subsequent serialization or deserialization), step 610, and designation of a second channel or subchannel for providing the output test data (following deserialization or serialization), step 615. For example, as illustrated in FIG. 1, serialize channel 170₁ was selected to receive the input (parallel) test data, while deserialize channel 180$_N$ was selected to provide the output (parallel) test data. Next, a first loop back connection of serial output to a next serial input is provided, step 620, and a second loop back connection of parallel output to a next parallel input is provided, step 625. A next loop back connection of serial output to a next serial input is provided, step 630, and a next loop back connection of parallel output to a next parallel input is provided, step 635. This loop back connection process continues, returning to step 630 and iterating steps 630 and 635, until all channels have corresponding loop back connections (other than the first and second designated channels), step 640. It should be noted that steps 610 through 635 may be done in parallel (or otherwise at the same time), such as when these connections are predetermined and provided as an integrated testing mode or through a pre-wired probe board, as discussed above. Alternatively, such connections may be made sequentially, such as during individual testing in a laboratory environment. Connection control through the various switches can also be provided from or through dedicated test pins or register control bits.

When all channels have such loop back connections in step 640, input test data is provided to the first channel, and may also be stored in memory, such as memory 155, step 645. The input test data is repeatedly serialized and deserialized through all corresponding channels to provide the output test data, step 650. The output test data is then compared with the input test data, with any adjustments for latency or skew, to determine a bit error rate, step 655. This empirical or measured bit error rate is then compared to a predetermined or predesignated bit error rate or level, step 660. When the measured bit error rate is not acceptable, such as above the predetermined rate, step 665, the SERDES is designated as failed, step 670. When the measured bit error rate is acceptable, such as at or below the predetermined rate in step 665, the SERDES is designated as passed, step 675. Following either step 670 or 675, the testing method may end, return step 680.

Numerous advantages of the present invention are readily apparent. The various embodiments provide for a testing mode of a multichannel SERDES device in which all channels may be tested simultaneously, resulting in a substantial savings of time and effort in the testing process. In addition, such simultaneous testing of all channels may be provided in a wide variety of ways, using either integrated (on-chip) testing circuitry, or external testing circuitry. When provided for integrated testing, the various embodiments of the invention may be provided as repeatable layouts or macros, for use in each channel of a multichannel device.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A serializer and deserializer data communication apparatus, the apparatus comprising:

a plurality of serialize data communication channels adapted to convert parallel data to serial data, a first serialize data communication channel of the plurality of serialize data communication channels designated to receive input parallel test data for subsequent serialization;

a plurality of deserialize data communication channels adapted to convert serial data to parallel data, each deserialize data communication channel paired with a corresponding serialize data communication channel of the plurality of serialize data communication channels, a first deserialize data communication channel of the plurality of deserialize data communication channels designated to provide output parallel test data;

a first plurality of switches, each switch of the first plurality of switches coupled between an output of one of the plurality of serialize data communication channels and an input of one of the plurality of deserialize data communication channels to provide a serial data loop-back connection; and a second plurality of switches, each switch of the second plurality of switches coupled between an output of one of the plurality of deserialize data communication channels and an input of one of the plurality of serialize data communication channels to provide a parallel data loop-back connection.

2. A serializer and deserializer data communication apparatus, the apparatus comprising:

a plurality of serialize data communication channels adapted to convert parallel data to serial data, a first serialize data communication channel of the plurality of serialize data communication channels designated to receive input parallel test data for subsequent serialization;

a plurality of deserialize data communication channels adapted to convert serial data to parallel data, each deserialize data communication channel paired with a corresponding serialize data communication channel of the plurality of serialize data communication channels, a first deserialize data communication channel of the plurality of deserialize data communication channels designated to provide output parallel test data;

a first plurality of switches, each switch of the first plurality of switches coupled between an output of a serialize data communication channel and an input of a deserialize data communication channel to provide a serial data loop-back connection;

a second plurality of switches, each switch of the second plurality of switches coupled between an output of a deserialize data communication channel and an input of a serialize data communication channel to provide a parallel data loop-back connection; and a memory coupled to the first serialize data communication channel to store the input parallel test data.

3. The apparatus of claim 2, wherein the memory is further coupled to the first deserialize data communication channel to store the output parallel test data.

4. The apparatus of claim 2, further comprising:
integrated testing circuitry coupled to the memory and to the first deserialize data communication channel, the integrated testing circuitry adapted to compare the input parallel test data and output parallel test data and determine a measured bit error rate.

5. The apparatus of claim 4, wherein the integrated testing circuitry is further adapted to provide a pass indication when the measured bit error rate is less than a first predetermined bit error rate or a fail indication when the measured bit error rate is greater than a second predetermined bit error rate.

6. The apparatus of claim 4, wherein the integrated testing circuitry is further adapted to provide for latency between the input parallel test data and the output parallel test data.

7. The apparatus of claim 2, further comprising:
a bit error rate tester coupled to the first deserialize data communication channel, the bit error rate tester adapted to compare the input parallel test data and output parallel test data and determine a measured bit error rate, and further adapted to provide a pass indication when the measured bit error rate is less than a predetermined bit error rate.

8. The apparatus of claim 2, wherein the first plurality of switches and second plurality of switches are adapted to be enabled during a test mode of the serializer and deserializer data communication apparatus, and disabled during a data transmission mode of the serializer and deserializer data communication apparatus.

9. A serializer and deserializer data communication apparatus, the apparatus comprising:
a plurality of serialize data communication channels adapted to convert parallel data to serial data, a first serialize data communication channel of the plurality of serialize data communication channels designated to provide output serial test data;

a plurality of deserialize data communication channels adapted to convert serial data to parallel data, each deserialize data communication channel paired with a corresponding serialize data communication channel of the plurality of serialize data communication channels, a first deserialize data communication channel of the plurality of deserialize data communication channels designated to receive input serial test data;

a first plurality of switches, each switch of the first plurality of switches coupled between an output of one of the plurality of serialize data communication channels and an input of one of the plurality of deserialize data communication channels to provide a serial data loop-back connection; and a second plurality of switches, each switch of the second plurality of switches coupled between an output of one of the plurality of deserialize data communication channels and an input of one of the plurality of serialize data communication channels to provide a parallel data loop-back connection.

10. A serializer and deserializer data communication apparatus, the apparatus comprising:
a plurality of serialize data communication channels adapted to convert parallel data to serial data, a first serialize data communication channel of the plurality of serialize data communication channels designated to provide output serial test data;

a plurality of deserialize data communication channels adapted to convert serial data to parallel data, each deserialize data communication channel paired with a corresponding serialize data communication channel of the plurality of serialize data communication channels, a first deserialize data communication channel of the plurality of deserialize data communication channels designated to receive input serial test data;

a first plurality of switches, each switch of the first plurality of switches coupled between an output of a serialize data communication channel and an input of a deserialize data communication channels to provide a serial data loop-back connection;

a second plurality of switches, each switch of the second plurality of switches coupled between an output of a deserialize data communication channel and an input of a serialize data communication channel to provide a parallel data loop-back connection; and a memory coupled to the first deserialize data communication channel to store the input serial test data.

11. The apparatus of claim 10, wherein the memory is further coupled to the first serialize data communication channel to store the output serial test data.

12. The apparatus of claim 10, further comprising:
integrated testing circuitry coupled to the memory and to the first serialize data communication channel, the integrated testing circuitry adapted to compare the input serial test data and output serial test data and determine a measured bit error rate.

13. The apparatus of claim 12, wherein the integrated testing circuitry is further adapted to provide a pass indication when the measured bit error rate is less than a first predetermined bit error rate or a fail indication when the measured bit error rate is greater than a second predetermined bit error rate.

14. The apparatus of claim 13, wherein the integrated testing circuitry is further adapted to provide for latency between the input serial test data and the output serial test data.

15. The apparatus of claim 10, further comprising:
a bit error rate tester coupled to the first serialize data communication channel, the bit error rate tester adapted to compare the input serial test data and output serial test data and determine a measured bit error rate, and further adapted to provide a pass indication when the measured bit error rate is less than a first predetermined bit error rate or a fail indication when the measured bit error rate is greater than a second predetermined bit error rate.

16. The apparatus of claim 10, wherein the first plurality of switches and second plurality of switches are adapted to be enabled during a test mode of the serializer and deserializer data communication apparatus, and disabled during a data transmission mode of the serializer and deserializer data communication apparatus.

17. A method of testing a serializer and deserializer data communication apparatus, the serializer and deserializer data communication apparatus having a plurality of serialize data communication channels adapted to convert parallel data to serial data and further having a plurality of deserialize data communication channels adapted to convert serial data to parallel data, the method comprising:
   coupling an output of a serialize data communication channel and an input of a deserialize data communication channel to provide a serial data loop-back connection;
   coupling an output of a deserialize data communication channel and an input of a serialize data communication channel to provide a parallel data loop-back connection;
   providing input parallel test data to a first serialize data communication channel of the plurality of serialize data communication channels;
   successively serializing and deserializing the input parallel test data through each corresponding serialize data communication channel of the plurality of serialize data communication channels and deserialize data communication channel of the plurality of deserialize data communication channels to provide output parallel test data; and
   comparing the output parallel test data and the input parallel test data.

18. The method of claim 17, further comprising:
storing the input parallel test data and the output parallel test data.

19. The method of claim 17, further comprising:
determining a measured bit error rate.

20. The method of claim 19, further comprising:
providing a pass indication when the measured bit error rate is less than a first predetermined bit error rate or providing a fail indication when the measured bit error rate is greater than a second predetermined bit error rate.

21. The method of claim 20, further comprising:
providing for latency between the input parallel test data and the output parallel test data.

22. A method of testing a serializer and deserializer data communication apparatus, the serializer and deserializer data communication apparatus having a plurality of serialize data communication channels adapted to convert parallel data to serial data and further having a plurality of deserialize data communication channels adapted to convert serial data to parallel data, the method comprising:
   coupling an output of a serialize data communication channel and an input of a deserialize data communication channel to provide a serial data loop-back connection;
   coupling an output of a deserialize data communication channel and an input of a serialize data communication channel to provide a parallel data loop-back connection;
   providing input serial test data to a first deserialize data communication channel of the plurality of deserialize data communication channels;
   successively deserializing and serializing the input serial test data through each corresponding deserialize data communication channel of the plurality of deserialize data communication channels and serialize data communication channel of the plurality of serialize data communication channels to provide output serial test data; and
   comparing the output serial test data and the input serial test data.

23. The method of claim 22, further comprising:
storing the input serial test data and the output serial test data.

24. The method of claim 22, further comprising:
determining a measured bit error rate.

25. The method of claim 24, further comprising:
providing a pass indication when the measured bit error rate is less than a first predetermined bit error rate or providing a fail indication when the measured bit error rate is greater than a second predetermined bit error rate.

26. The method of claim 25, further comprising:
providing for latency between the input parallel test data and the output parallel test data.

* * * * *